US008603917B2

(12) United States Patent
Kwon et al.

(10) Patent No.: US 8,603,917 B2
(45) Date of Patent: Dec. 10, 2013

(54) METHOD OF PROCESSING A WAFER

(75) Inventors: Woon Seong Kwon, Singapore (SG); Nagarajan Ranganathan, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 37 days.

(21) Appl. No.: 13/284,546

(22) Filed: Oct. 28, 2011

(65) Prior Publication Data

US 2012/0178258 A1 Jul. 12, 2012

(30) Foreign Application Priority Data

Oct. 28, 2010 (SG) ................................ 201007953-1

(51) Int. Cl.
*H01L 21/306* (2006.01)
*B44C 1/22* (2006.01)

(52) U.S. Cl.
USPC ............. 438/692; 438/706; 438/745; 216/58; 216/83; 216/88

(58) Field of Classification Search
USPC .................. 438/692, 706, 745; 216/58, 83, 88
See application file for complete search history.

(56) References Cited

U.S. PATENT DOCUMENTS

| 6,916,725 | B2 | | 7/2005 | Yamaguchi |
| 7,446,404 | B2 | | 11/2008 | Huang et al. |
| 7,816,227 | B2 | * | 10/2010 | Chen et al. .................... 438/424 |
| 2007/0032061 | A1 | | 2/2007 | Farnworth et al. |
| 2007/0048896 | A1 | | 3/2007 | Andry et al. |
| 2007/0178694 | A1 | | 8/2007 | Hiatt |
| 2007/0224811 | A1 | * | 9/2007 | Wang et al. ................... 438/678 |
| 2008/0047490 | A1 | * | 2/2008 | Xia et al. ....................... 118/719 |
| 2008/0111213 | A1 | | 5/2008 | Akram et al. |
| 2010/0120242 | A1 | * | 5/2010 | Chevacharoenkul et al. 438/633 |
| 2010/0148360 | A1 | * | 6/2010 | Lin et al. ....................... 257/737 |

OTHER PUBLICATIONS

Beyne, The Rise of the 3rd Dimension for System Integration, Proceedings of IITC 2006, p. 1.
Pozder, et al., Back-End Compatibility of Bonding and Thinning Processes for a Wafer-Level 3D Interconnect Technology Platform, Proceedings of IITC 2004, p. 102.
Banerjee, et al., 3-D ICs: A Novel Chip Design for Improving Deep-Submicrometer Interconnect Performance and Systems-on-Chip Integration, Proceedings of the IEEE, vol. 89, No. 5, p. 602, 2001.
Pozder, et al., Exploration of the Scaling Limits of 3D Integration, to be published, MRS 2006 Fall Proceedings, MRS Proceedings 2006 970 : 0970-Y02-01].

(Continued)

*Primary Examiner* — Shamim Ahmed
(74) *Attorney, Agent, or Firm* — K. David Crockett, Esq.; Niky Economy Syrengelas, Esq.; Crockett & Crockett, PC

(57) ABSTRACT

According to embodiments of the present invention, a method of processing a wafer is provided. The wafer includes a plurality of through-wafer interconnects extending from a frontside surface of the wafer to a backside surface of the wafer. The method includes removing a part of wafer material of the back-side such that a portion of the wafer material between the through-wafer interconnects is removed, thereby exposing a portion of the through-wafer interconnects, forming a layer of low-k dielectric material between the through-wafer interconnects, and planarizing the layer of low-k dielectric material such that a surface of the portion of the through-wafer interconnect is exposed.

18 Claims, 8 Drawing Sheets

(56) References Cited

OTHER PUBLICATIONS

Karl Dietz, Fine Lines in High Yield Through Silicon Via Technology, CircuitTree, Tech Talk.

Mitsuhashi, et al., Development of 3D-Packaging Process Technology for Stacked Memory Chips, MRS2007, Mater. Res. Soc. Symp. Proc. vol. 970 (2007), 0970-Y03-06].

Koester, et al., Wafer Level 3D Integration Technologies, IBM J. Res. & Dev., vol. 52 No. 6 (2008).

Munck, et al., Grinding and Mixed Silicon Copper CMP of Stacked Patterned Wafers for 3D Integration, MRS 2007, MRS Fall Meeting Symposium Y: Enabling Technologies for 3-D Integration, Boston, MA, United States, Nov. 2006.

* cited by examiner

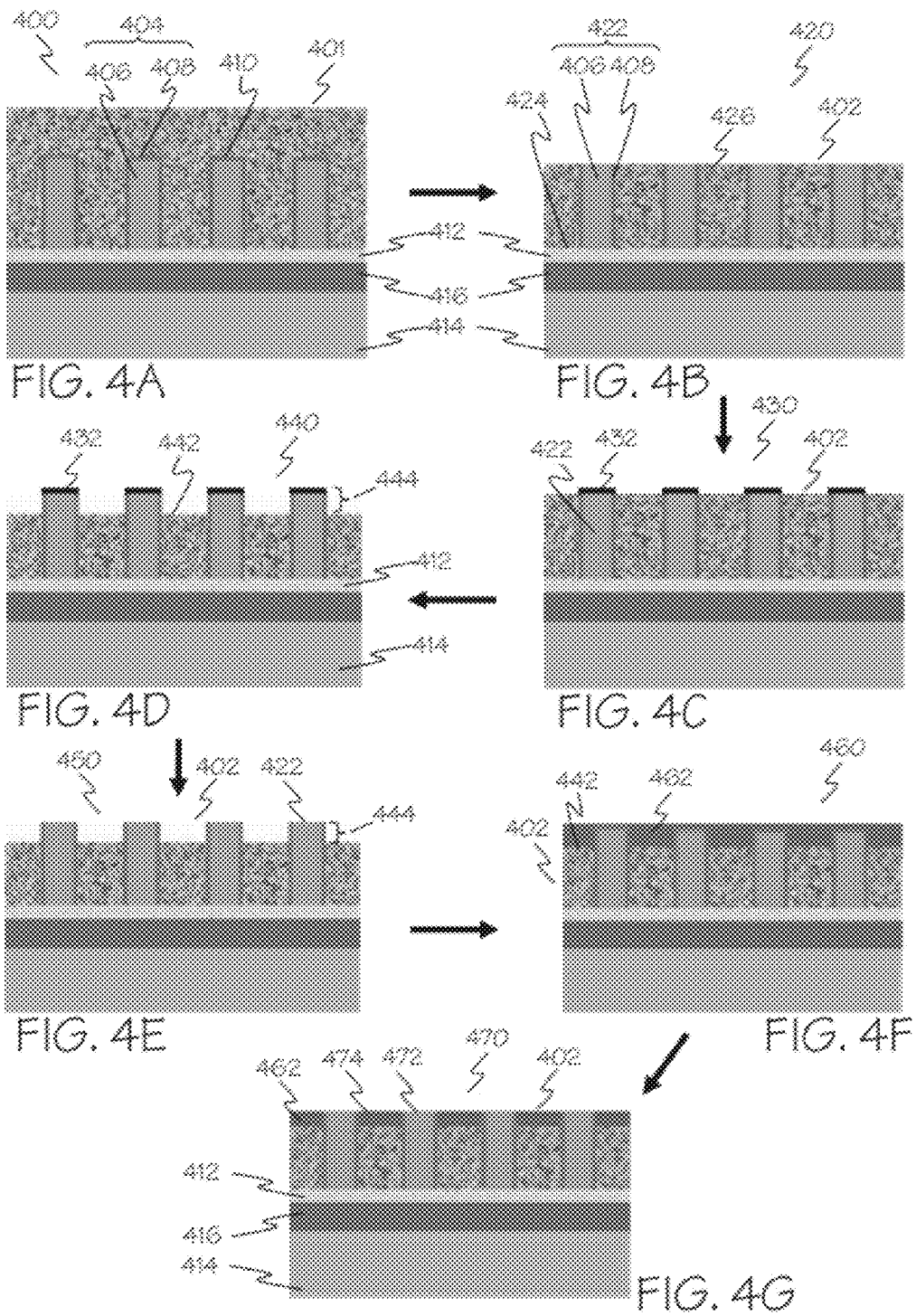

METHOD OF PROCESSING A WAFER

CROSS-REFERENCE TO RELATED APPLICATION

This application claims the benefit of priority of Singapore patent application No. 201007953-1, filed 28 Oct. 2010, the content of it being hereby incorporated by reference in its entirety for all purposes.

TECHNICAL FIELD

Various embodiments relate to a method of processing a wafer.

BACKGROUND 3D integration of die is an attractive technology to meet future performance needs of integrated circuits. Benefits can be realized in signal bandwidth and latency, power consumption, form-factor, and cost. In addition, 3D technology may facilitate heterogeneous integration, for example III-V materials on silicon (Si) or memory on logic.

3D interconnect technology can be implemented as either die-to-wafer or wafer-to-wafer and each approach has its benefits and limitations. For example, die-to-wafer allows the use of known good die, which can result in yield enhancement of the final die stack. However, die-to-wafer results in lower throughput, as each die needs to be aligned and placed onto the wafer. This process can be especially slow if there are small dies or if a high degree of alignment is required. In comparison, for wafer-to-wafer integration, selection of known good die prior to the bonding process is not possible, but a much higher throughput can be achieved.

Wafer thinning and back-side insulation is a necessary technology component of 3D integration, as it may allow the interlayer distance to be reduced, thereby allowing a higher density of vertical interconnects. In bulk Si, wafer thinning may be challenging as there is no natural etch stop. The final thickness may depend on the thinning process control capabilities and may be limited by the thickness uniformity specifications of the Si removal process.

Moreover, the properties of back-side insulation layer affect the inter-layer performance for chip-to-wafer or wafer-to-wafer integration. With the inter-layer distance being decreased, either substrate coupling or inter-chip coupling effect becomes detrimental to device performance.

In addition, the insulation layer may have interface issues in terms of adhesion to the wafer and may allow drift or diffusion of the metal of the TSV into the insulation layer, which may be a source for Time-Dependent Dielectric Breakdown (TDDB) reliability issue. The insulation layer also has defects such as cracks and has large parasitics.

Furthermore, conventional process use lithography-processes on a backside surface (dual side alignment), and have a limitation in patterning resolution and alignment accuracy for TSV passivation opening between the TSV and the resist opening.

SUMMARY

According to an embodiment, a method of processing a wafer is provided. The wafer includes a plurality of through-wafer interconnects extending from a frontside surface of the wafer to a backside surface of the wafer. The method may include removing a part of wafer material of the back-side such that a portion of the wafer material between the through-wafer interconnects is removed, thereby exposing a portion of the through-wafer interconnects, forming a layer of low-k dielectric material between the through-wafer interconnects, and planarizing the layer of low-k dielectric material such that a surface of the portion of the through-wafer interconnect is exposed.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 4A to 4G show schematic cross sectional views of a method of processing a wafer, according to various embodiments.

FIG. 7A shows a simulated eye diagram for a device wafer with a conventional passivation layer while

DETAILED DESCRIPTION

Figure 1:
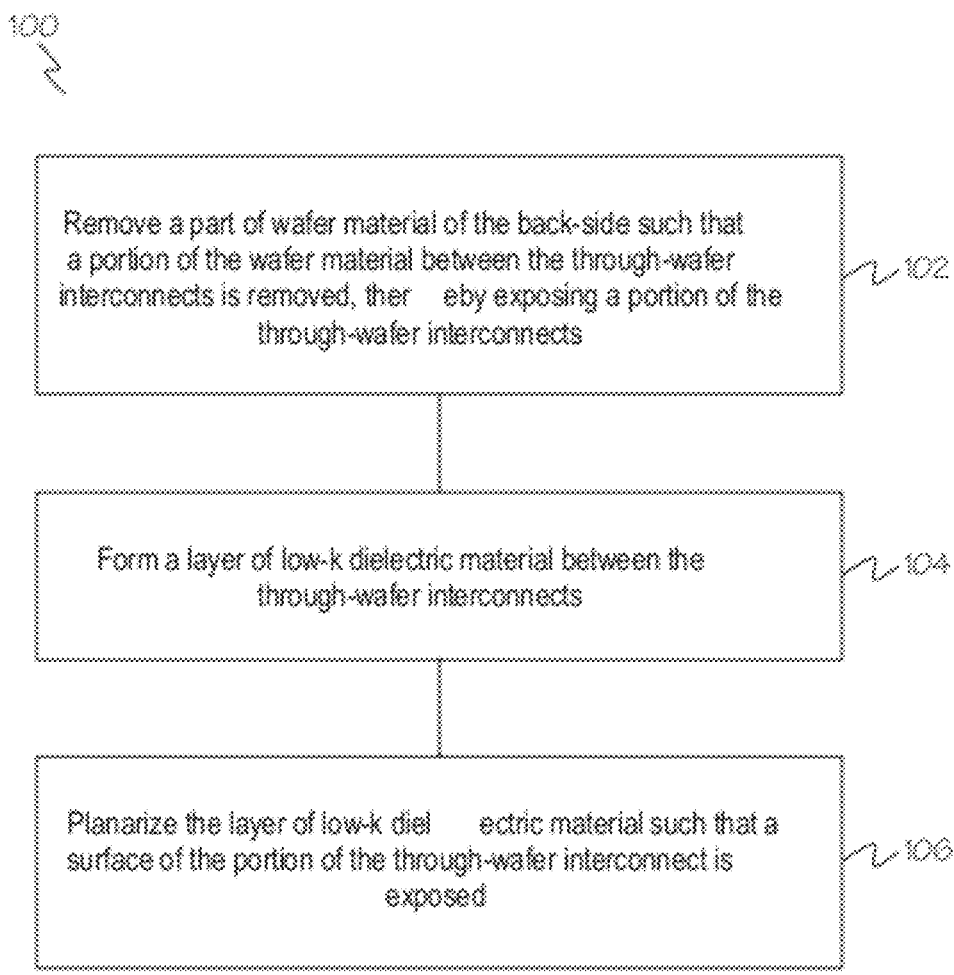
FIG. 1 shows a flow chart illustrating a method of processing a wafer, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

In the context of various embodiments, the term "about" as applied to a numeric value encompasses the exact value and a variance of +/−5% of the value.

Various embodiments may provide a method of processing a wafer. The method may include wafer level thinning, for example back-side thinning, and back-side passivation, for example of a wafer or device wafer, for three-dimensional (3D) integrated circuit (IC) and/or three dimensional (3D) through silicon via (TSV) applications. The wafer processed or fabricated in accordance with various embodiments may also be used for interconnection to integrated circuitry or redistribution layer connection for 3D stacking with other wafers or chips. The method of various embodiments may not include a photolithography process, for example to open contact or expose a through-wafer interconnect on a back-side of the wafer.

In various embodiments, the wafer (e.g. a device wafer) or substrate may include one or more vias such as silicon vias formed extending from a surface (e.g. a frontside surface) of the wafer substantially into the wafer. The wafer may be bonded, at least temporarily, to a carrier or a handling wafer, which may support the wafer, for example during any subsequent processes including but not limited to grinding, polishing, etching, chemical vapour deposition (CVD), physical vapor deposition (PVD) and/or wet processes.

In various embodiments, the wafer may be thinned down, for example with grinding and chemical mechanical polishing (CMP) processes. The wafer may be thinned down from a backside surface of the wafer until the vias are exposed through the backside surface of the wafer, thereby forming through vias (e.g. TSVs) or through-wafer interconnects extending from the frontside surface of the wafer to the backside surface of the wafer.

The wafer may then be blanket-etched from the back-side, using either a dry etching process or a wet etching process. The etching process etches into the wafer and remove a part of wafer material of the back-side such that a portion of the wafer material between the through-wafer interconnects is removed, thereby exposing a portion of the through-wafer interconnects. The etching process may be a spin-etching process, for example via wet etching with megasonic cleaning, on the backside surface of the wafer, thereby removing a part of wafer material of the back-side. The etch back process may facilitate minimization of, for example, copper (Cu) drift, removal or minimization of metallic/organic/particle contaminants and the formation of recessed through vias or through-wafer interconnects.

A passivation layer, for example a layer of low-k dielectric material, may be deposited on the back-side of the wafer between the exposed portions of the through-wafer interconnects. The layer of low-k dielectric material may also be deposited over the exposed portions of the through-wafer interconnects. The layer of low-k dielectric material may be an organic layer and may be a polymer including but not limited to benzocyclobutene (BCB), polyimide (PI), polybenzozazole (PBO), and Parylene polymers.

Subsequently, at least a portion of the layer of low-k dielectric material may be removed or etched back by, for example, a planarization process, e.g. by dry etching such as plasma etching, or CMP. In various embodiments, as the exposed portions of the through-wafer interconnects (e.g. copper surface) are covered by the layer of Cu-BTA compound formed by surface treating the exposed copper surface by benzotriazole (BTA) treatment, and the low-k dielectric material, the filling material (e.g. Cu) of the through-wafer interconnects may not drift into or onto the wafer (e.g. Si) during etch back, thereby minimizing or preventing contamination such as Cu contamination.

In the context of various embodiments, the term "via" may mean a structure extending into a wafer or substrate. The via may include a structure with a filling material.

In the context of various embodiments, the terms "through via" and "through-wafer interconnect" may mean a structure having a conductive filling material and extending through a wafer such that the structure has conductive portions or surfaces exposed through opposed sides of the wafer, for example the front-side and the back-side of the wafer so as to provide interconnection between circuitry on the front-side of the wafer to the circuitry on the back-side of the wafer, and/or to provide connection with external circuitry. In other words, a "through-wafer interconnect" may mean a structure extending from a frontside surface of the wafer to a backside surface of the wafer.

In the context of various embodiments, a "via" is not formed through the wafer so that a "through via" is rendered after a substrate is suitably thinned to expose the surfaces of the via, thereby forming the through via.

In the context of various embodiments, the terms "backside surface" and "frontside surface" mean opposed surfaces of a wafer such that a through via or a through-wafer interconnect extends from the frontside surface to the backside surface.

In the context of various embodiments, the terms "frontside" and "back-side" mean opposed sides of a wafer such that the "frontside surface" is on the "front-side" of the wafer and the "backside surface" is on the "back-side" of the wafer.

In the context of various embodiments, while reference is made to a through-wafer interconnect or a through via (e.g. a through silicon via), it should be appreciated that the wafer or device wafer may include a plurality of through-wafer interconnects or through vias.

In the context of various embodiments, a low-k dielectric material means a material having a small or low dielectric constant relative to silicon dioxide, which has a dielectric constant of about 3.9.

In order that the invention may be readily understood and put into practical effect, particular embodiments will now be described by way of examples and not limitations, and with reference to the figures.

FIG. 1 shows a flow chart 100 illustrating a method of processing a wafer, according to various embodiments. The wafer includes a plurality of through-wafer interconnects extending from a frontside surface of the wafer to a backside surface of the wafer.

At 102, a part of wafer material of the back-side is removed such that a portion of the wafer material between the through-wafer interconnects is removed, thereby exposing a portion of the through-wafer interconnects. In various embodiments, the removal of the part of the back-side wafer material may be by wet etching or dry etching.

At 104, a layer of low-k dielectric material is formed between the through-wafer interconnects. The layer of low-k dielectric material may also be formed over the through-wafer interconnects. In various embodiments, forming the layer of low-k dielectric material may include incubating the layer of low-k dielectric material at a temperature of between room temperature (e.g. about 25° C.) and about 250° C.

At 106, the layer of low-k dielectric material is planarized such that a surface of the portion of the through-wafer interconnect is exposed. In various embodiments, the planarization process may include dry etching or chemical mechanical polishing (CMP).

In various embodiments, the method may further include forming a layer (e.g. a capping layer or a protection layer) over at least a portion of the exposed through-wafer interconnect portions prior to removing the part of the back-side wafer material. The layer formed may include a polymeric compound. The polymeric compound may include the filling material of the through-wafer interconnect. In various embodiments, forming this layer may include treating at least a portion of the exposed through-wafer interconnect portions to form the layer, for example by applying benzotriazole (BTA). However, it should be appreciated that different types of azoles may be used, e.g. 1H-Pyrazole-3,5-diamine, 1-Benzoyl benzotriazole, 1-P-Chloro-Benzoyl benzotriazole, 1-P-Methoxy-Benzoyl benzotriazole, 4-Phenyl-1H-pyrazole-3,5-diamine, N-[Benzotriazol-1-yl-(phenyl)-methylene]-N'-phenyl-hadrazine and 2-phenylbenzimidazole.

In various embodiments, the method may further include removably coupling a carrier over the frontside surface of the wafer. For example, the carrier may be removably coupled to the frontside surface of the wafer or to a back-end-of-line (BEOL) layer disposed on the frontside surface of the wafer. The carrier may be a silicon wafer.

In various embodiments, the wafer may be formed by thinning a back-side of a substrate having a plurality of vias extending from a frontside surface of the substrate substantially into the substrate, such that the vias are exposed on the back-side of the substrate. In other words, in order to form the wafer, a substrate having a plurality of vias extending from a frontside surface of the substrate substantially into the substrate (e.g. a full thickness substrate or wafer as fabricated or as obtained from a vendor) may first be provided. The substrate may be thinned from the back-side until at least the vias are exposed on the back-side of the substrate such that through vias are formed. This thinned substrate including the through vias extending from the frontside surface to the backside surface of the substrate is equivalent to the wafer having a plurality of through-wafer interconnects extending from the frontside surface of the wafer to the backside surface of the wafer.

In this context, the term "substrate" means a wafer having one or more vias extending into the substrate (e.g. a full thickness wafer with one or more vias, e.g. as received from a vendor) while the term "wafer" means a wafer having one or more through vias or through-wafer interconnects extending from a frontside surface to a backside surface of the wafer. In this context, the substrate and the wafer refer to equivalent features and the via and the through via refer to equivalent features, but at different stages of processing, i.e. the wafer refers to a thinned substrate.

In various embodiments, thinning the back-side of the substrate may include a first step of grinding using a first grinding surface of about 400 mesh and may further include a second step of grinding using a second grinding surface of about 1800 mesh to about 2000 mesh after the first step of grinding, and may further include chemical mechanical polishing after the second step of grinding.

In various embodiments, a thickness of the layer of low-k dielectric material formed may be about 3 μm or more (i.e. ≥3 μm).

In various embodiments, the layer of low-k dielectric material formed may be at least substantially planar.

In various embodiments, the layer of low-k dielectric material may have a dielectric constant of between about 2 and about 3.

In various embodiments, the layer of low-k dielectric material may include or may be of a polymer selected from the group consisting of benzocyclobutene (BCB), polyimide (PI), polybenzoxazole (PBO) and Parylene.

Figure 2:
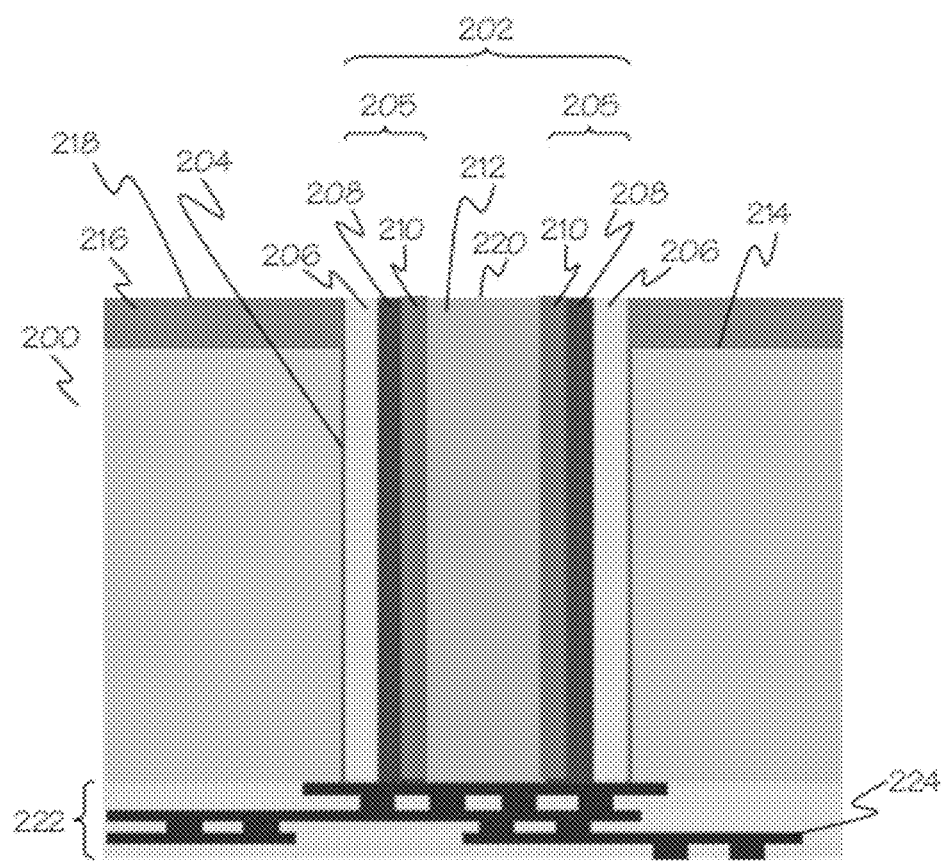
FIG. 2 shows a schematic cross sectional view of a processed wafer having a through-wafer interconnect, according to various embodiments.

FIG. 2 shows a schematic cross sectional view of a processed wafer 200 having a through-wafer interconnect 202, according to various embodiments. The wafer 200 may be a silicon wafer and the through-wafer interconnect 202 may be a through silicon via (TSV).

In order to form the through-wafer interconnect 202, an aperture 204 may be formed through the wafer 200. A 3-layer stack 205 may be deposited on the sidewalls of the aperture 204, the 3-layer stack 205 including a layer of oxide insulation liner 206, a layer of diffusion barrier 208 (e.g. a titanium (Ti) diffusion barrier) and a layer of seed layer 210 (e.g. a Cu seed layer). A filling material 212, for example a conductive filling material such as copper (Cu) may be deposited into the aperture 204, for example by electrochemical plating (ECP). Therefore, the through-wafer interconnect 202 includes the 3-layer stack 205 and the filing material 212.

It should be appreciated that other suitable conductive materials or metals including but not limited to aluminum (Al), silver (Ag) and tungsten (W) may be used as the filling material 212 to fill the through via or through-wafer interconnect 202. In addition, the filling material 212 may include nickel (Ni) and tin (Sn), where electroplating of such material may be carried out to fill the through-wafer interconnect 202.

While not shown clearly in FIG. 2, it should be appreciated that the 3-layer stack 205 at least substantially surrounds the filling material 212.

As shown in FIG. 2, the through-wafer interconnect 202 protrudes from the surface 214 of the wafer 200. A layer of passivation 216, for example a layer of low-k dielectric material, may be deposited on a back-side of the wafer 200 on the surface 214 and over the protruded through-wafer interconnect 202, thereby covering the surface 220 of the through-wafer interconnect 202. Subsequently, CMP or etch back may be performed such that the surface 218 of the passivation layer 216 and the surface 220 of the through-wafer interconnect 202 are at least substantially coplanar. Such surface co-planarity may enable the forming of subsequent interconnection layers.

The wafer 200 may include a back-end-of-line (BEOL) layer or portion 222 on a front-side of the wafer 200. The BEOL layer 222 may include passive and/or active devices (not shown), for example transistors, capacitors and resistors, and one or more levels of redistribution wiring or redistribution layers 224.

The fabrication process, including passivation of a wafer, according to various embodiments will now be described below, by way of examples and not limitations.

Figure 3:
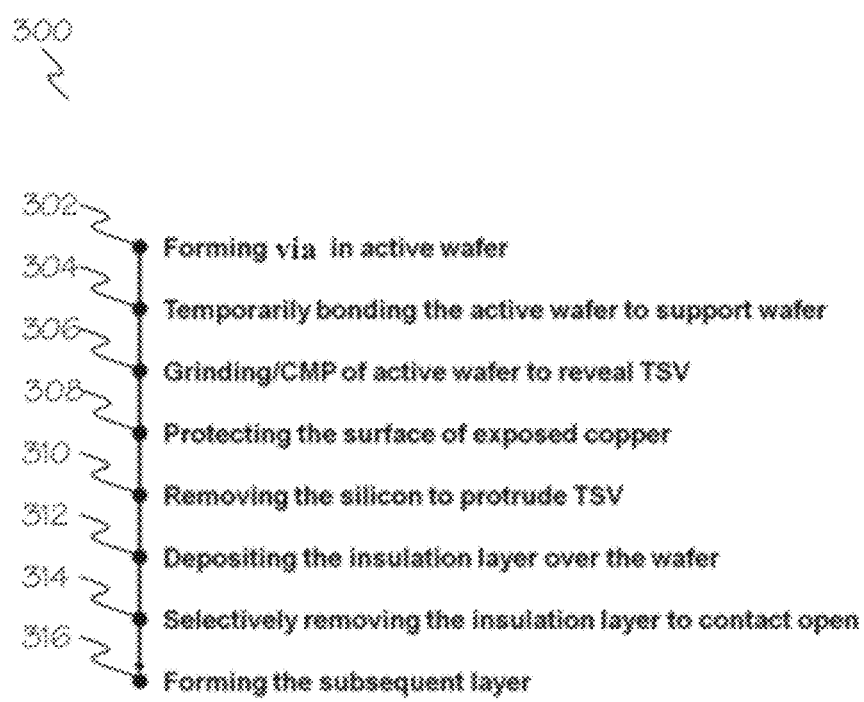
FIG. 3 shows a process flow of a method of processing a wafer, according to various embodiments.

FIG. 3 shows a process flow 300 of a method of processing a wafer, FIGS. 4A to 4G show schematic cross sectional views of a method of processing a wafer while FIGS. 5A to 5G show microscopy images of the processed structures, according to various embodiments.

At 302, one or more vias are formed in a substrate (for example an active wafer, e.g. a silicon wafer). The vias may be patterned and etched with an optimized Bosch process to obtain a vertical profile, a small hardmask undercut and scallop smoothening. Then, a 3-layer stack deposition may be carried out to deposit a layer of oxide insulation, a layer of Ti diffusion barrier, and a Cu seed layer. The vias may then be filled with copper (Cu) by electroplating using Cu electroplating tool, followed by an annealing step to relieve any stress that may be formed during any previous processing steps.

Figure 5A:
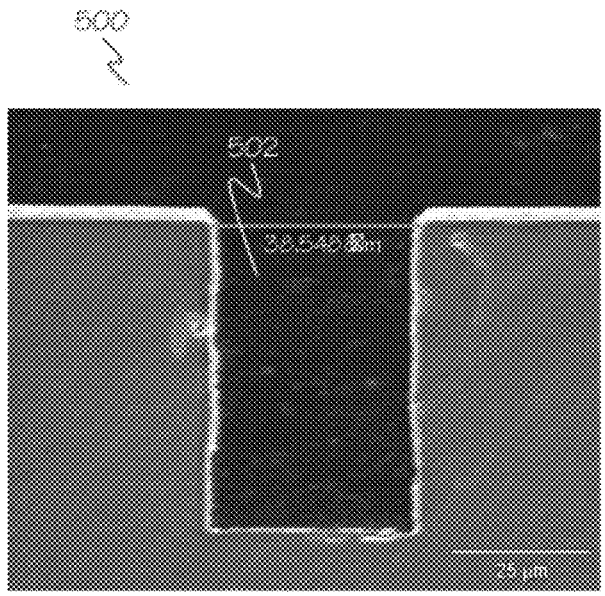
FIGS. 5A to 5G show microscopy images of the processed structures, according to various embodiments.

FIG. 5A shows a scanning electron microscopy (SEM) image 500 showing a cross sectional view of a via structure 502 formed, having a width of about 40 μm and a length of about 50 μm. The scale bar at the bottom right of FIG. 5A represents 25 μm.

Figure 5B:
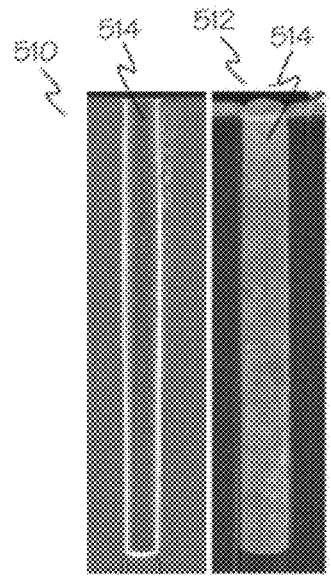

FIG. 5B shows SEM images 510 and 512 showing cross sectional views of a via structure 514 formed, having a width of about 5 μm and a length of about 50 μm.

Subsequently, one or more metal layers or a BEOL portion may be formed on a front-side of the substrate.

At 304, the substrate with the one or more vias, together with the one or more metal layers or a BEOL portion, may be temporarily or removably bonded or coupled to a carrier (e.g. a silicon carrier wafer or a handling wafer), for example using glue.

As shown in FIG. 4A, a structure 400 may be obtained. The structure 400 includes a substrate 401 having one or more vias (four vias are illustrated as an example), as represented by 404 for one via. Each of the vias 404 includes a filling material 406 (e.g. Cu), substantially surrounded by a 3-layer stack 408 over the top surface 410 and on the sides of the filling material 406. For illustration purposes, the 3-layer stack 408 is shown as a single layer in FIGS. 4A to 4G.

The substrate 401 further includes a BEOL portion 412. As shown in FIG. 4A, the structure 400 includes a carrier 414 bonded to the substrate 401 with glue 416.

At 306, the substrate may be thinned down from a backside of the substrate, for example by back grinding and chemical mechanical polishing (CMP), in order to reduce the thickness of the substrate and to expose the vias, thereby forming a wafer (i.e. after thinning of the substrate) with through vias (e.g. through silicon vias, TSVs) or through-wafer interconnects.

In this context, the term "substrate" means a wafer having one or more vias extending into the substrate (e.g. a full thickness wafer with one or more vias, e.g. as received from a vendor) while the term "wafer" means a wafer having one or more through vias or through-wafer interconnects extending from a frontside surface to a backside surface of the wafer. As an example and not limitation, a substrate having a via may be thinned down so as to form a wafer with a through via. In this context, the substrate and the wafer refer to equivalent feature and the via and the through via refer to equivalent feature, but at different stages of processing.

At 306, the process may include a coarse grinding step to thin the substrate from its original thickness to a thickness of about 125-150 μm using a grinding surface of about 400 mesh, followed by a fine grinding step to further reduce the thickness to about 100 μm using a grinding surface of about 1800 mesh to about 2000 mesh. Next, a mechanical polishing step (e.g. CMP) may be performed to further reduce the thickness to about 30-60 μm. In various embodiments, the substrate may be thinned to a thickness of about 40 μm.

In various embodiments, the grinding and polishing steps may be performed on uniform regions of the silicon substrate so as to minimize any stresses associated with the mechanical grinding and polishing steps which may damage any fine features in or on the silicon substrate. For example, a Si/Cu CMP process may be applied to overcome the practical limitations on the uniformity of the back-side thinning which may originate from the earlier blind thinning process such as grinding.

As shown in FIG. 4B, a structure 420 may be obtained. The structure 420 includes a wafer 402 with one or more through vias or through-wafer interconnects (four through-wafer interconnects are illustrated as an example), as represented by 422 for one through-wafer interconnect. The through-wafer interconnects 422 extend from a frontside surface 424 of the wafer 402 to a backside surface 426 of the wafer 402. Each of the through-wafer interconnects 422 includes the filling material 406 (e.g. Cu), substantially surrounded by the 3-layer stack 408 on the sides of the filling material 406. As compared to the structure 400 (FIG. 4A), the 3-layer stack 408 over the top surface 410 has been removed during the thinning process, thereby exposing the through-wafer interconnects 422. In other words, the filling material 406 of each of the through-wafer interconnects 422 is exposed through the backside surface 426 such that each of the through-wafer interconnects 422 has a conductive surface exposed through the backside surface 426.

Figure 5C:
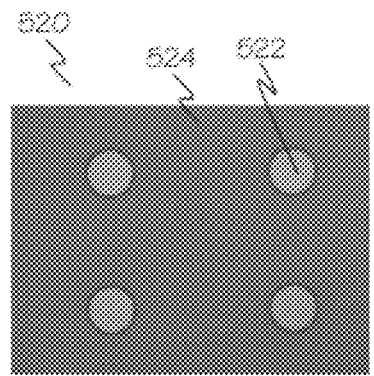

FIG. 5C shows an optical microscopy image 520 showing a top view of a wafer, after Si/Cu CMP, thinned down to about 40 μm. In FIG. 5C, four through-wafer interconnects, as represented by 522 for one through-wafer interconnect, are shown, having a width (or radius), of about 40 μm.

At 308, optionally, the surface of the exposed through-wafer interconnects may be treated so as to protect the exposed surface, for example surface-treated with Benzotriazole (BTA) so as to form a layer (e.g. a capping layer) over the exposed surface to protect the conductive filling material 406 from possible chemical damage resulting from subsequent processing such as the etch back process at 310. The layer may include a polymeric compound, for example formed with the conductive filling material 406. This layer may prevent or minimize contamination of the exposed surface having the filing material 406 from chemical or particles during the etch back process. Where the filling material 406 is Cu, Benzotriazole (BTA) treatment may protect the exposed Cu surface by forming Cu-BTA compound, which is a polymeric compound, as a capping layer on the exposed copper surface. However, it should be appreciated that other suitable protection means may be employed, e.g. using other types of azoles.

As shown in FIG. 4C, a structure 430 may be obtained, having capping layers, as represented by 432 for one capping layer, over the exposed surfaces of the through-wafer interconnects 422, after selective capping of the exposed surfaces of the through-wafer interconnects 422.

At 310, a part of wafer material of the back-side (e.g. wafer material of the backside surface) surrounding the through-wafer interconnects are removed. In other words, a portion of the wafer material between the through-wafer interconnects is removed, thereby exposing a portion of the through-wafer interconnects. Therefore, a part of the wafer material (e.g. silicon) may be selectively removed or etched back such that a portion of the through-wafer interconnects are exposed.

Removal of part of wafer material of the back-side forms a residual surface on the back-side such that a portion of each through-wafer interconnect is exposed or protrudes through the residual surface of the wafer.

In various embodiments, the etch back process may be dry etch or wet etch. For example, wet chemical etching using tetramethylammonium hydroxide (TMAH) may be carried out for the etch-back process, providing an etching rate of about 0.5 μm/min for silicon, with good selectivity to $SiO_2$.

As shown in FIG. 4D, a structure 440 may be obtained, where the wafer 402 has a residual surface 442 such that a portion 444 of the through-wafer interconnects 422 are exposed or protrudes through the residual surface 442, after removal of a part of the wafer material of the back-side. In various embodiments, the protruding portions 444 may have a height in a range of between about 3 μm and about 10 μm above the residual surface 442, for example between about 5 μm and about 8 μm, depending on the variation in the depth or length of the through-wafer interconnects 422 and the required height of the protruding portions 444. However, it should be appreciated that the protruding portions 444 may have other heights.

In various embodiments, where surface treatment is performed at 308, the capping layer may then be removed, for example by polishing. As shown in FIG. 4E, a structure 450 may be obtained. It should be appreciated that the capping layer may also be removed during etch back or CMP of the low-k dielectric material in subsequent processes.

In various embodiments where the optional surface treatment at 308 is not carried out, the etch back process at 310 may be performed on the structure 420 (FIG. 4B), resulting in the structure 450 (FIG. 4E).

Figure 5D:
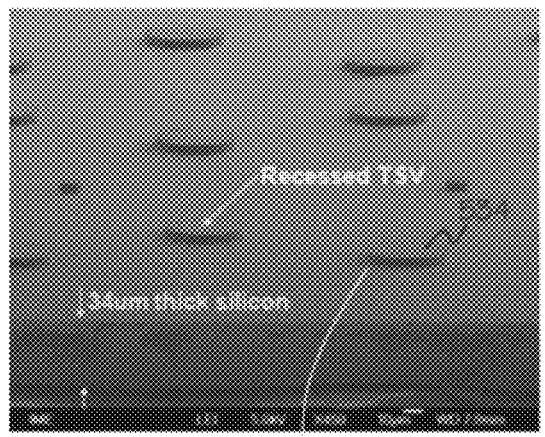

FIG. 5D shows a scanning electron microscopy (SEM) image 530 showing a tilted view of through-wafer interconnections, as represented by 534 for one through-wafer interconnect, where a portion of the through-wafer interconnects 534 is exposed, after wet etch-back of the silicon material with TMAH at 310. The thickness of the wafer (i.e. the distance from the frontside surface to the residual surface) is about 34 µm. The scale bar for the SEM image 530 represents 10 µm.

FIG. 5D further shows a scanning electron microscopy (SEM) image 532 showing an enlarged tilted view of the through-wafer interconnection 534, where a portion of the through-wafer interconnect 534 is exposed or in other words, protrudes from the residual surface of the wafer. The through-wafer interconnect 534 has a width (or radius), of about 40 µm. The scale bar for the SEM image 532 represents 10 µm.

At 312, a layer of low-k dielectric material (e.g. a passivation layer) may be deposited over the wafer, on the back-side of the wafer between the through-wafer interconnects. The layer of low-k dielectric material may also be deposited over the exposed portion of each of the through-wafer interconnects. The layer of low-k dielectric material may be of a low temperature curable organic material, that may be deposited and cured or incubated at a temperature of 250° C. or less (i.e. ≤250° C.) to form a layer with a thickness of about 3 µm or more (i.e. 3 µm). In various embodiments, the low-k dielectric material may have a dielectric constant of about 2.6 or less (i.e. ≤2.6). In various embodiments, the layer of low-k dielectric material may be a polymer, including but not limited to benzocyclobutene (BCB), polyimide (PI), polybenzozazole (PBO), and Parylene polymers.

As shown in FIG. 4F, a structure 460 may be obtained. The structure 460 includes a layer of low-k dielectric material 462 deposited over the residual surface 442 of the wafer 402 and the protruding or exposed portions 444 of the through-wafer interconnects 422. The layer of low-k dielectric material 462 may be planar.

Figure 5E:
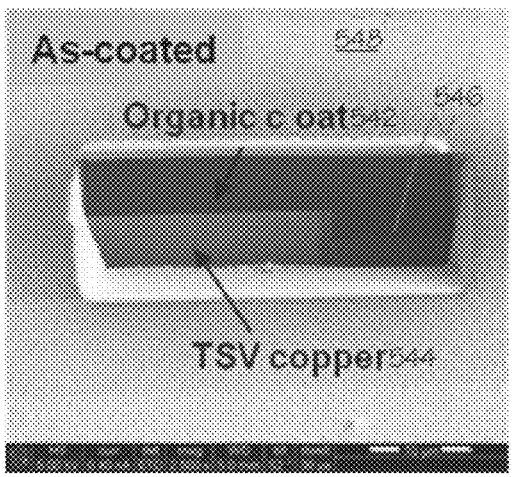

FIG. 5E shows a scanning electron microscopy (SEM) image 530 showing a tilted view of a layer of low-k dielectric material (organic coat) 542 deposited over the through-wafer interconnect topography structure (TSV copper) 544 and the residual surface 546 of the wafer. While not shown clearly, the layer of low-k dielectric material 542 is also deposited between adjacent through-wafer interconnects 544. In addition, as shown in FIG. 5E, a layer of conductive coating 548, e.g. platinum, may be deposited over the layer of low-k dielectric material 542, to minimise or prevent damage to the layer of low-k dielectric material 542, for example as a result of electron charging and/or bombardment, during focused ion beam (FIB) SEM analysis to obtain the SEM image 530. The scale bar represents 10 µm.

At 314, the deposited layer of low-k dielectric material may be selectively removed or etched back to open contacts of the through-wafer interconnects. A planarization process may be performed to remove a portion of the passivation layer such that a surface of the exposed portion of each through-wafer interconnect is exposed. In other words, the filling material of the through-wafer interconnect is exposed through the layer of low-k dielectric material such that each through-wafer interconnect has a conductive surface exposed through the layer of low-k dielectric.

In various embodiments, the planarization process may include dry etching such as plasma etching or chemical mechanical polishing (CMP).

As shown in FIG. 4G, a structure 470 may be obtained, where a portion of the passivation layer 462 is removed such that the through-wafer interconnects 422 are exposed (i.e. the surface 472 of each through-wafer interconnect 422 is exposed) and that the surface 472 of the through-wafer interconnects 422 and the surface 474 of the passivation layer 462 are at least substantially coplanar. In other words, the over-burden passivation layer over the through-wafer interconnects 422 are removed. Therefore, the structure 470 includes a wafer 402 with back-side passivation and through-wafer interconnects 422.

In various embodiments, after planarization, the protruding portions 444 may have a height in a range of between about 3 µm and about 10 µm above the residual surface 442, for example between about 5 µm and about 8 µm. However, other heights may be possible. In various embodiments, the thickness of the passivation layer 462, after planarization, may be more than about 2 µm, for example between about 3 µm and about 10 µm, e.g. between about 5 µm and about 8 µm. However, other thicknesses may be possible.

In various embodiments, the removal of the over-burden passivation layer may depend on the planarization method and the density of the protruding portions 444 or the density of the through-wafer interconnects 422.

Figure 5F:
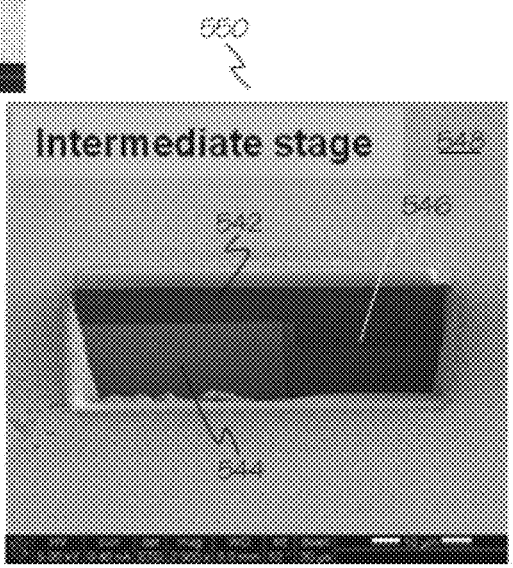

FIG. 5F shows a scanning electron microscopy (SEM) image 550 showing a tilted view of the layer of low-k dielectric material 542 at an intermediate stage after having partially removed part of the layer of low-k dielectric material 542 via plasma etching. In addition, as shown in FIG. 5F, a layer of conductive coating 548 may be deposited over the layer of low-k dielectric material 542, to minimise or prevent damage to the layer of low-k dielectric material 542. The scale bar represents 10 µm.

Figure 5G:
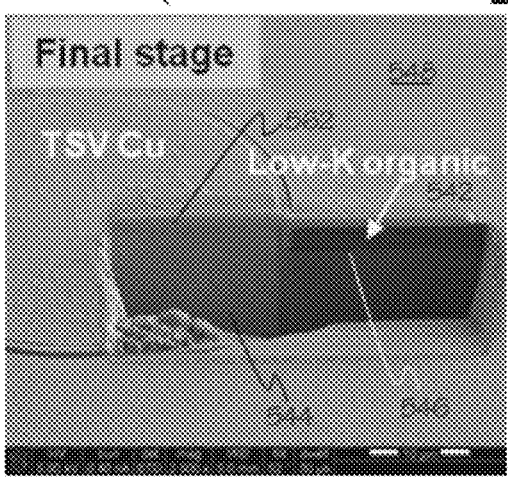

FIG. 5G shows a scanning electron microscopy (SEM) image 560 showing a tilted view of a completed structure after removal of part of the layer of low-k dielectric material via plasma etching such that a surface 562 of the exposed portion of the through-wafer interconnect (TSV Cu) may be exposed. In addition, as shown in FIG. 5G, a layer of conductive coating 548 may be deposited over the layer of low-k dielectric material 542 and the surface 562, to minimise or prevent damage to the layer of low-k dielectric material 542 and the TSV Cu. The scale bar represents 10 µm.

At 316, further processing may be performed, for example forming one or more subsequent layers over the back-side of the wafer. In addition, the carrier may be detached from the wafer.

The method of various embodiments may provide improved insulation or passivation and exposed through-wafer interconnects on a back-side of a wafer, to provide 3D IC process platform. The layer of low-k dielectric material, which may act as a passivation layer, may suppress metal diffusion, for example Cu diffusion, and/or may minimise substrate coupling through the thin wafer or die where redistribution layers or microbumps are processed or provided on the back-side of the wafer prior to stacking with other wafers or chips.

Figure 6A:
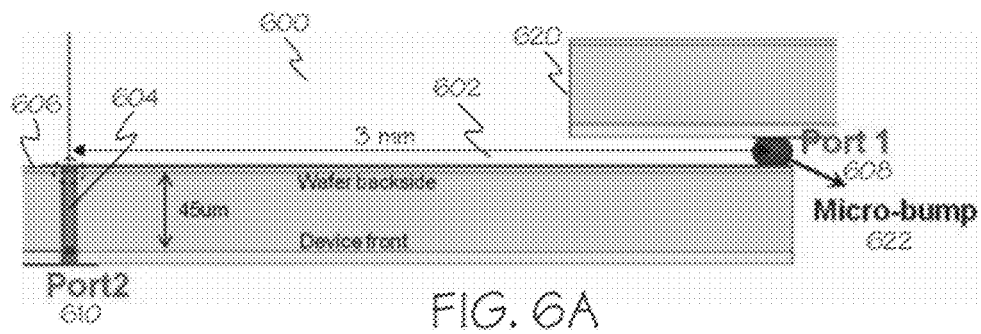
FIG. 6A shows a schematic cross sectional view of a stacked structure for simulation, according to various embodiments.

FIG. 6A shows a schematic cross sectional view of a stacked structure 600 for frequency response simulation, according to various embodiments. The stacked structure includes a wafer 602 having a through-wafer interconnect 604, a layer of low-k dielectric material 606 on a back-side of the wafer 602, a first port (Port 1) 608 on the back-side of the wafer 602 in electrical communication with the through-wafer interconnect 604 (for example via a redistribution line) and a second port (Port 2) 610 on the front-side of the wafer 602 in electrical communication with the through-wafer interconnect 604. The stacked structure 600 includes another wafer 620 electrically connected to the first port 608 of the wafer 602 via a micro-bump 622.

For simulation purposes, the layer of low-k dielectric material may be a conventional plasma-enhanced chemical vapor deposition (PECVD) silicon nitride (SiN) layer with a dielectric constant of about 7.6 and a thickness of about 0.2 µm, or a layer of benzocyclobutene (BCB) of various embodiments with a dielectric constant of about 2.6 and a thickness of about 3 µm.

Figure 6B:
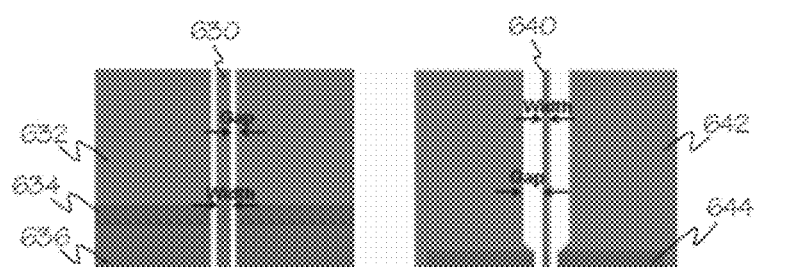
FIG. 6B shows schematics for simulation, based on the embodiment of FIG. 6A.

FIG. 6B shows schematics for simulation, based on the embodiment of FIG. 6A. FIG. 6B shows the expanded cross-sectional views at the position marked by the dashed circular line in FIG. 6A.

The left figure of FIG. 6B illustrates a wafer with the layer of BCB of a thickness of about 3 µm of various embodiments, showing a central strip 630 of the coplanar waveguide, metal planes 632, 636, acting as ground return path for the transmission, and an overlap area 634 of the metal planes 632, 636. The width or line width shown in the figure is about 20 µm while the gap is about 10 µm.

The right figure of FIG. 6B illustrates a wafer with the conventional PECVD SiN layer of a thickness of about 0.2 µm, showing a central strip 640 of the coplanar waveguide, metal planes 642, 646, acting as ground return path for the transmission, and an overlap area 644 of the metal planes 642, 646. The width or line width shown in the figure is about 10 µm while the gap is about 35 µm.

Figure 6C:
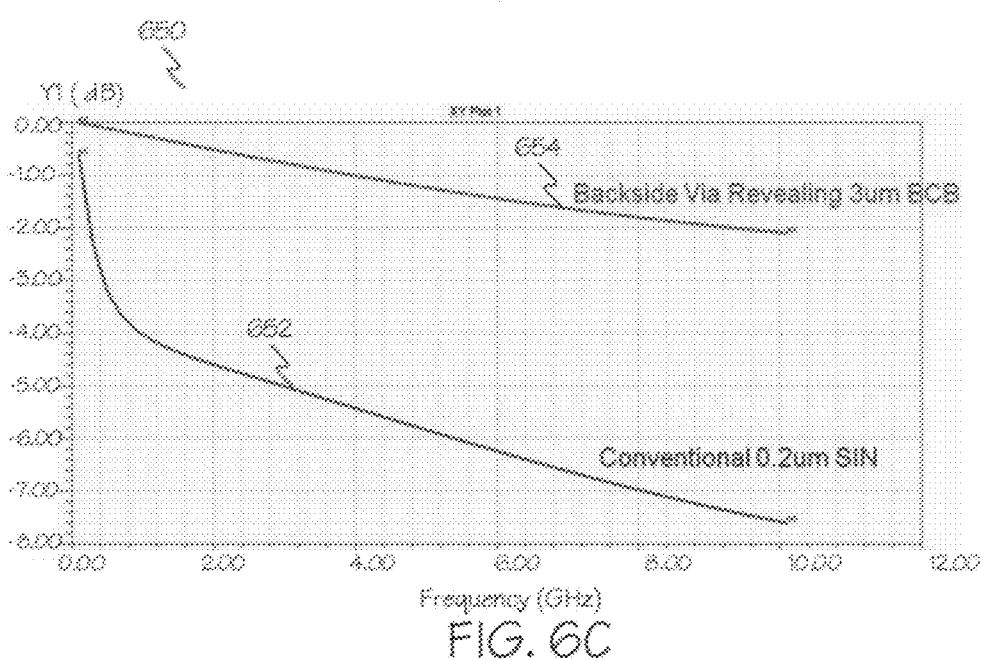
FIG. 6C shows a plot of simulated insertion loss.

FIG. 6C shows a plot 650 of simulated insertion loss for a back-side redistribution line as shown in FIG. 6A, for determining signal integrity. The plot 650 shows the result 652 for a wafer with the conventional PECVD SiN layer of a thickness of about 0.2 µm and the result 654 for a wafer with the layer of BCB of a thickness of about 3 µm of various embodiments.

As shown in FIG. 6C, the result 654 for a wafer with a layer of low-k dielectric material (BCB layer) processed in accordance with various embodiments shows a reduced insertion loss compared to the result 652 for a wafer with a conventional PECVD SiN passivation layer. For example, at about 2 GHz, the result 654 shows an insertion loss of about 0.5 dB compared to an insertion loss of about 4.6 dB for the result 652, and at about 10 GHz, the result 654 shows an insertion loss of about 2.2 dB compared to an insertion loss of about 7.5 dB for the result 652.

Figure 7A:
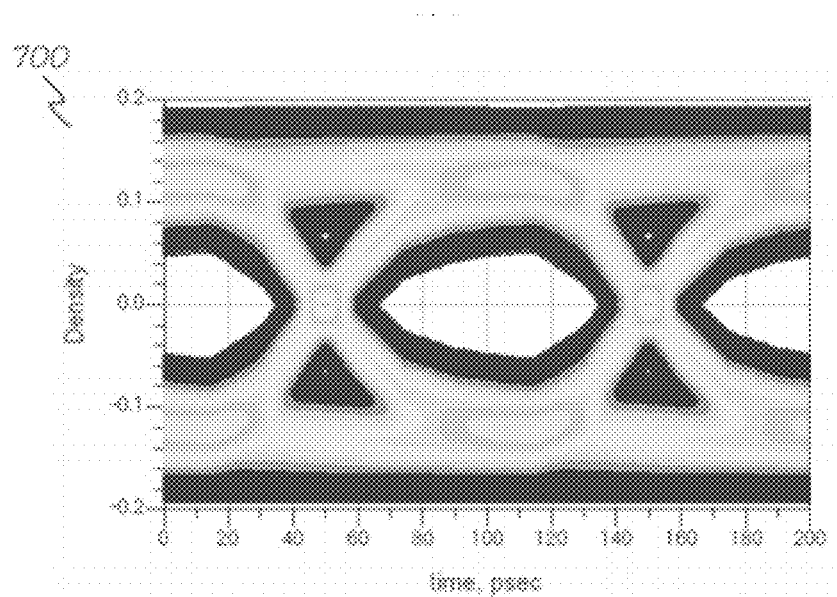

FIG. 7A shows a simulated eye diagram 700 for a device wafer with a conventional PECVD SiN passivation layer, which exhibits a jitter root mean square (RMS) of about 4.24 ps and an eye height of about 0.1 V.

Figure 7B:
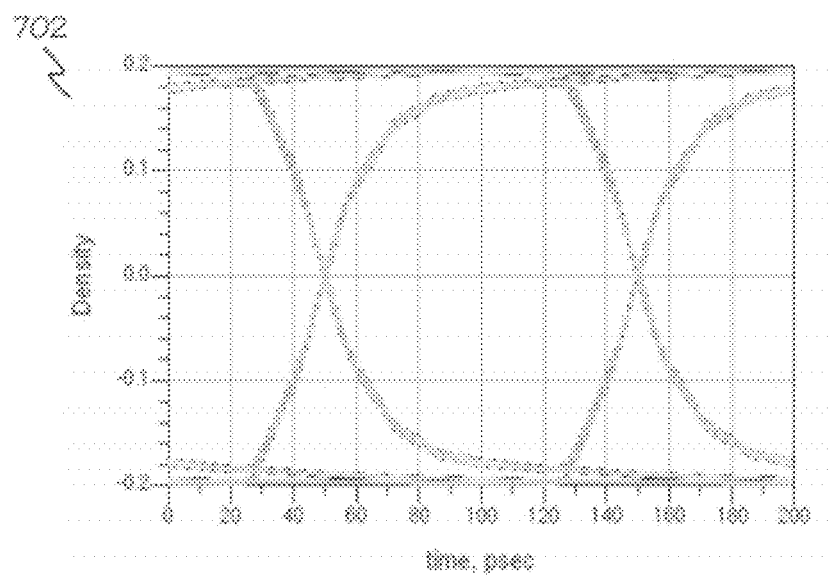
FIG. 7B shows a simulated eye diagram for a device wafer with a layer of low-k dielectric material processed according to various embodiments.

FIG. 7B shows a simulated eye diagram 702 for a device wafer with a layer of low-k dielectric material (BCB layer) processed according to various embodiments, which exhibits improved performances with a jitter root mean square (RMS) of about 0.48 ps and an eye height of about 0.336 V.

Various embodiments may provide an integrated process including back-side wafer thinning and passivation for 3D IC applications. In various embodiments, the wet etch-back to expose the through-wafer interconnects may result in well-controlled repeatability and reduced process defect. In various embodiments, the deposition of the low-k thick dielectric layer and subsequent planarization process, without a photolithography process to open or expose the through-wafer interconnects on the back-side of the wafer, enables easy process implementation and good electrical properties of the through-wafer interconnects and the wafer. In addition, the method of various embodiments may enable higher manufacturability and low substrate coupling for 3D IC platforms.

The method of various embodiments may be employed in 3D-related process platform (e.g. chip stacking or wafer stacking) for 3D TSV packages and 3D IC applications, for example for mobile processors (mobile CPUs), computing processors (computing CPUs), and high density memory. The method may improve the process control and reliability in comparison to conventional lithography process, and may enable improved electrical properties through the reduction of parasitics and the reduction in back-side contamination by metallic and/or organic substances and/or particles with the coating of a low-k and thick dielectric layer on the back-side of the wafer. In addition, the interface between the wafer and the layer of low-k dielectric material may be improved with improved adhesion of the layer of low-k dielectric material.

The method of various embodiments may be applied to a 65 nm logic technology.

While the invention has been particularly shown and described with reference to specific embodiments, it should be understood by those skilled in the art that various changes in form and detail may be made therein without departing from the spirit and scope of the invention as defined by the appended claims. The elements of the various embodiments may be incorporated into each of the other species to obtain the benefits of those elements in combination with such other species, and the various beneficial features may be employed in embodiments alone or in combination with each other. The scope of the invention is thus indicated by the appended claims and all changes which come within the meaning and range of equivalency of the claims are therefore intended to be embraced.

The invention claimed is:

1. A method of processing a wafer, the wafer comprising a plurality of through-wafer interconnects extending from a frontside surface of the wafer to a backside surface of the wafer, the method comprising:
    removing a part of wafer material of the back-side such that a portion of the wafer material between the through-wafer interconnects is removed, thereby exposing a portion of the through-wafer interconnects;
    forming a layer of low-k dielectric material between the through-wafer interconnects; and
    planarizing the layer of low-k dielectric material such that a surface of the portion of the through-wafer interconnect is exposed.

2. The method as claimed in claim 1, further comprising forming a layer over at least a portion of the exposed through-wafer interconnect portions prior to removing the part of the back-side wafer material.

3. The method as claimed in claim 2, wherein the layer formed over at least a portion of the exposed through-wafer interconnect portions comprises a polymeric compound.

4. The method as claimed in claim 2, wherein forming the layer over at least a portion of the exposed through-wafer interconnect portions comprises applying an azole.

5. The method as claimed in claim 4, wherein the azole is benzotriazole.

6. The method as claimed in claim 1, wherein removing the part of the back-side wafer material comprises wet etching or dry etching.

7. The method as claimed in claim 1, wherein forming the layer of low-k dielectric material comprises incubating at a temperature of between room temperature and about 250° C.

8. The method as claimed in claim 1, wherein planarizing the layer of low-k dielectric material comprises dry etching or chemical mechanical polishing.

9. The method as claimed in claim 1, wherein a thickness of the layer of low-k dielectric material formed is ≥3 µm.

10. The method as claimed in claim 1, wherein the layer of low-k dielectric material formed is at least substantially planar.

11. The method as claimed in claim 1, wherein the low-k dielectric material comprises a polymer selected from the group consisting of benzocyclobutene, polyimide, polybenzoxazole and Parylene.

12. The method as claimed in claim 1, wherein the low-k dielectric material has a dielectric constant of between about 2 and about 3.

13. The method as claimed in claim 1, further comprising removably coupling a carrier over the frontside surface of the wafer.

14. The method as claimed in claim 13, wherein the carrier comprises a silicon wafer.

15. The method as claimed in claim 1, wherein the wafer is formed by thinning a back-side of a substrate comprising a plurality of vias extending from a frontside surface of the substrate into the substrate, such that the vias are exposed on the back-side of the substrate.

16. The method as claimed in claim 15, wherein thinning the back-side of the substrate comprises a first step of grinding using a first grinding surface of about 400-mesh.

17. The method as claimed in claim 16, wherein thinning the back-side of the substrate further comprises a second step of grinding using a second grinding surface of about 1800 mesh to about 2000 mesh after the first step of grinding.

18. The method as claimed in claim 17, wherein thinning the back-side of the substrate further comprises chemical mechanical polishing after the second step of grinding.

\* \* \* \* \*